(12) United States Patent  (10) Patent No.: US 10,147,499 B1
Botea  (45) Date of Patent: Dec. 4, 2018

(54) MEMORY POWER-UP TESTING SYSTEM

(71) Applicant: Apple Inc., Cupertino, CA (US)

(72) Inventor: Dragos F. Botea, San Jose, CA (US)

(73) Assignee: Apple Inc., Cupertino, CA (US)

( * ) Notice: Subject to any disclaimer, the term of this patent is extended or adjusted under 35 U.S.C. 154(b) by 358 days.

(21) Appl. No.: 15/174,192

(22) Filed: Jun. 6, 2016

(51) Int. Cl.
*G11C 29/12* (2006.01)
*G06F 3/06* (2006.01)
*G11C 7/22* (2006.01)
*G11C 29/08* (2006.01)

(52) U.S. Cl.
CPC ............ *G11C 29/12* (2013.01); *G06F 3/0614* (2013.01); *G06F 3/0653* (2013.01); *G06F 3/0659* (2013.01); *G06F 3/0673* (2013.01); *G11C 7/22* (2013.01); *G11C 29/08* (2013.01)

(58) Field of Classification Search
CPC ....... G11C 29/028; G11C 29/08; G11C 29/10; G11C 29/12015; G11C 29/38; G11C 29/46; G11C 29/48; G11C 29/56004; G06F 11/2284; G06F 2011/2278
See application file for complete search history.

(56) References Cited

U.S. PATENT DOCUMENTS

| | | | |
|---|---|---|---|
| 5,404,543 A * | 4/1995 | Faucher | G06F 1/3215 713/323 |
| 5,479,413 A * | 12/1995 | Sicola | G11C 29/02 714/718 |
| 5,875,195 A | 2/1999 | Dixon | |
| 7,162,625 B2 | 1/2007 | Stern et al. | |
| 7,443,759 B1 | 10/2008 | Rowlands et al. | |
| 8,538,720 B2 | 9/2013 | Hsu | |
| 9,810,738 B2 * | 11/2017 | Tsuboi | G01R 31/3177 |
| 2012/0260109 A1 * | 10/2012 | Zhai | G06F 1/3203 713/300 |
| 2015/0278151 A1 * | 10/2015 | Tang | G06F 12/0246 711/103 |
| 2016/0086678 A1 | 3/2016 | Botea et al. | |

OTHER PUBLICATIONS

Dragos F. Botea, "Memory Internal Comparator Testing System," U.S. Appl. No. 15/172,768 dated Jun. 3, 2016, 33 pages.

* cited by examiner

*Primary Examiner* — Harry W Byrne
*Assistant Examiner* — R Lance Reidlinger
(74) *Attorney, Agent, or Firm* — Meyertons, Hood, Kivlin, Kowert & Goetzel, P.C.; Erik A. Heter

(57) ABSTRACT

In some embodiments, a system includes a memory testing circuit configured to perform a test to determine whether a portion of a memory is operational at a specified amount of time after a power-up request by performing operations. The operations may include sending a power-up request to the portion. The operations may further include sending, at the specified amount of time after the power-up request, a write request for a write operation at the portion. The operations may further include sending a read request that requests a read operation for data written by the write operation. The operations may further include determining, based on data received in response to the read request, whether the portion correctly performed the read operation and the write operation.

20 Claims, 5 Drawing Sheets

MEMORY POWER-UP TESTING SYSTEM

BACKGROUND

Technical Field

This disclosure relates generally to a memory power-up testing system.

Description of the Related Art

Memory devices typically store large amounts of data and are able to retrieve the data upon request. As modern memory devices include more storage and are expected to return data at a faster and faster rate, designs for the memory devices become more complex. Complex memory devices may be difficult to fabricate correctly. Additionally, complex memory devices may be more prone to failure during operation. Thus, memory devices may operate incorrectly.

A memory device may be tested (e.g., by a manufacturer) to determine whether the memory device correctly stores and retrieves data. One mechanism that may be used to test the memory device is a hardware testing device, such as a built in self-test (BIST). A BIST may enable the memory device to perform tests on itself to verify some or all of the internal functionality of the memory device. Some companies provide commercial BIST designs. Commercial BIST designs may be able to verify a set of functions of the memory device.

SUMMARY

In various embodiments, an integrated circuit is disclosed that includes a memory, a self-test unit (e.g., a built in self-test (BIST) unit), and a memory testing circuit. The self-test unit may be standardized and thus may not be designed to test the functions of the memory. For example, where the memory has specialized functionality or properties the self-test unit may be unable to test the specialized functionality or properties. Additionally, the self-test unit may be designed to only perform specific tests of the memory. For example, the self-test unit may not be designed to test a power-up time of the memory (e.g., an amount of time needed for the memory to correctly respond to instructions after transitioning from an "off" state). The memory testing circuit may cause the integrated circuit to test functions (e.g., a power-up speed) of the memory that the self-test unit is not designed to test.

For example, in one embodiment, the memory testing circuit detects a power-up request from the self-test unit directed to a particular portion (e.g., a particular way group) of the memory. Upon a certain amount of time (e.g., corresponding to an amount of time in which the particular portion should be powered up) passing, the testing circuit may send signals (e.g., a write instruction addressing a location followed by a read instruction addressing the location) to the particular portion. If the particular portion has failed to power up within the certain amount of time, the write and/or read operation may fail, causing the memory testing circuit to fail to read the data from the write operation. Thus, the memory testing circuit may be used to test functions of the memory, which may correspond to functions the self-test unit is not designed to test.

Figure 1:
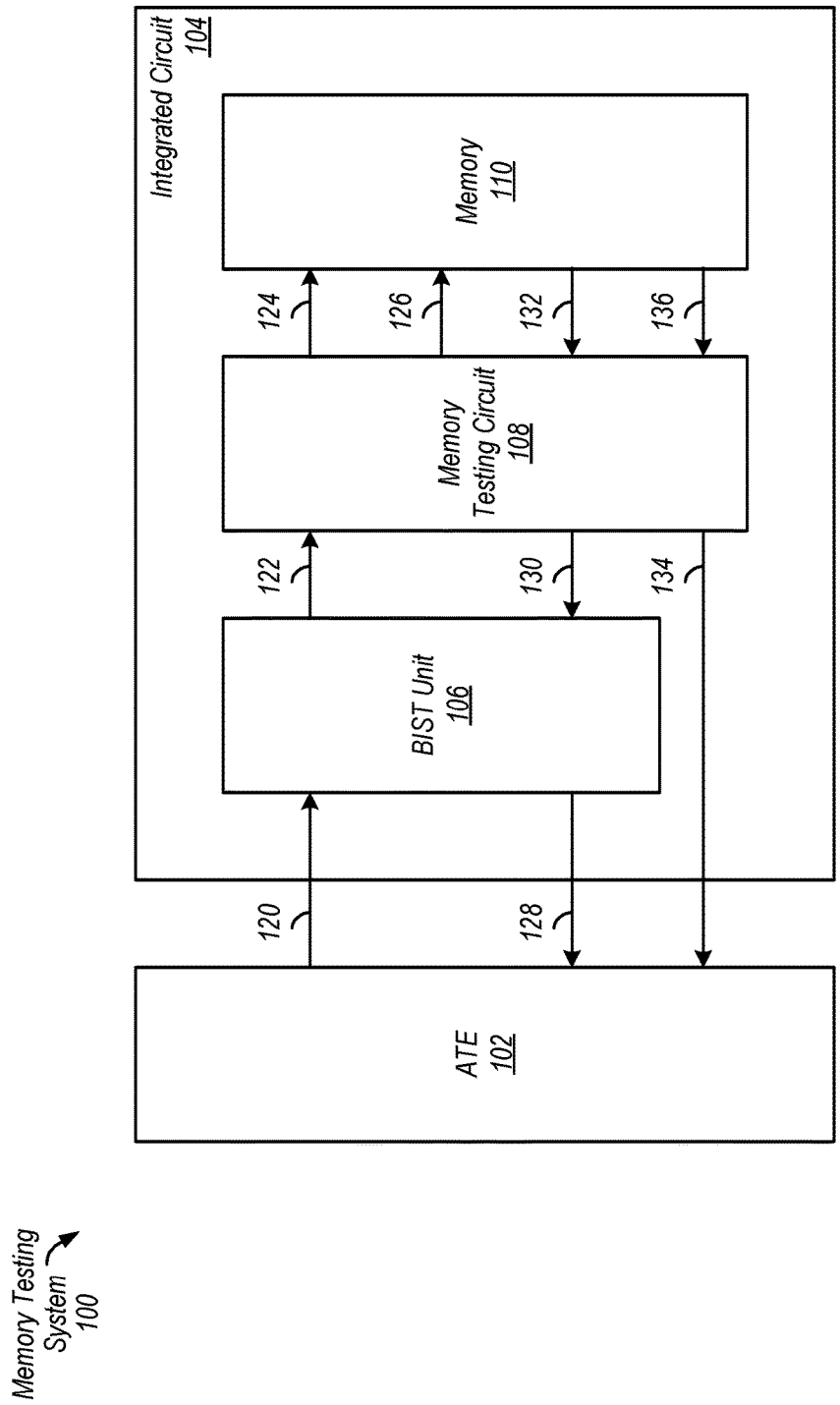
FIG. 1 is a block diagram illustrating one embodiment of an exemplary memory power-up testing system.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "memory testing circuit configured to send a write request" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a memory device having eight portions, the terms "first portion" and "second portion" can be used to refer to any two of the eight portions, and not, for example, just logical portions 0 and 1.

When used in the claims, the term "or" is used as an inclusive or and not as an exclusive or. For example, the phrase "at least one of x, y, or z" means any one of x, y, and z, as well as any combination thereof (e.g., x and y, but not z).

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION

As described above, a commercial built in self-test (BIST) design may be able to verify a set of features of a memory device. However, the commercial BIST design may be unable to verify other features (e.g., whether a memory is operational at a specified time) of the memory device. Designing a custom BIST to test these other features may be undesirably expensive. As will be discussed below, a memory testing circuit may be used to test the other features.

A memory testing system is described herein where a memory testing circuit performs a test to determine whether a particular portion of a memory is operational at a specified time during a power-up sequence (e.g., a specified amount of time after a power-up request). The memory testing circuit may request various memory operations at the particular portion at the specified time. Based on whether the memory operations were performed correctly, the memory testing circuit may determine whether the particular portion was operational at the specified time.

As used herein, "operational" refers to a state where a memory device is able to correctly perform memory operations in response to memory requests. For example, a memory device may be considered operational if the memory device correctly writes data received as part of a write request to an addressed memory location.

As used herein, "power-up sequence" refers to a time period during which a device (or a portion of a device) transitions from a state where the device (or the portion of the device) is powered off to a time at which the device is expected to be operational. In some cases, a device may be operational prior to the completion of the power-up sequence. As used herein, "power-up sequence" does not refer to a transition out of a sleep mode of the device.

The present disclosure references a "portion of memory" and a "different portion of memory." As used herein, the term "different" means that the two memory portions cannot completely overlap each other. Thus, it must be the case that at least some of the memory locations in the "portion" are not in the "different portion," vice versa, or both. The two portions also may not overlap at all.

As used herein, a memory operation being performed "correctly" refers to the operations being performed according to design specifics for the memory. For example, a system may determine that a write operation followed by a read operation that address a single memory were performed correctly by determining that the read operation returns the data written by the write operation.

This disclosure initially describes, with reference to FIG. 1, various portions of various embodiments of a memory testing system. Example processes performed by various embodiments of a memory testing system are described with reference to FIGS. 2 and 3. A method performed by an embodiment of a memory testing circuit is described with reference to FIG. 4. Finally, an exemplary computing system that includes at least a portion of an exemplary memory power-up testing system is described with reference to FIG. 5.

Turning now to FIG. 1, a block diagram of various embodiments of an exemplary memory testing system 100 is shown. In the illustrated embodiment, memory testing system 100 includes automated test equipment (ATE) 102 and integrated circuit 104. Additionally, in some embodiments, integrated circuit 104 includes built-in self-test (BIST) unit 106, memory testing circuit 108, and memory 110.

ATE 102 may communicate with BIST unit 106 (e.g., a self-test unit) to perform general testing of various functionalities of memory 110. Accordingly, ATE 102 may send test requests 120 to BIST unit 106 and may receive test results 128 in response to test requests 120. Additionally, ATE 102 may request a test to determine whether a particular portion of memory 110 (e.g., some or all of memory 110) is operational at a specified amount of time after a power-up request. In some embodiments, ATE 102 may indicate the specified amount of time to memory testing circuit 108 directly. In other embodiments, ATE 102 may send the request to memory testing circuit 108 via BIST unit 106. Alternatively, the specified amount of time may be preprogrammed into memory testing circuit 108. In the illustrated embodiment, ATE 102 is external to integrated circuit 104. In other embodiments, ATE 102 may be part of integrated circuit 104.

BIST unit 106 may request various memory operations from memory 110 as part of testing performed in response to test requests 120. BIST unit 106 may send various memory requests 122 to memory 110 (e.g., via memory testing circuit 108) and may receive various memory responses 130 from memory 110 (e.g., again via memory testing circuit 108) in response to memory requests 122. Additionally, BIST unit 106 may send power-up requests to portions of memory 110 that are currently powered down (e.g., not currently operational). In some embodiments, BIST unit 106 may wait for a power-up response from memory 110 prior to sending memory requests 122 to memory 110. In some embodiments, BIST unit 106 may wait a particular amount of time after the power-up request before sending memory requests 122 to memory 110. For example, BIST unit 106 may wait an amount of time large enough that all memory devices BIST unit 106 is configured to test should be operational (e.g., according to design specifications) prior to sending memory requests 122 to memory 110. In a particular embodiment, BIST unit 106 has limited functionality by design (e.g., BIST unit 106 is a generic, mass-produced self-test tool designed to test many types of memory devices). Other self-test tools may also be used in conjunction with the illustrated devices.

As further described below with reference to FIG. 2, memory testing circuit 108 may test whether a particular portion of memory 110 is operational at a specified amount of time after a power-up request (e.g., a power-up request generated by BIST unit 106 or by memory testing circuit 108). In particular, memory testing circuit 108 may send memory operation request(s) 126 to the particular portion of memory 110. In response to memory operation request(s) 126, memory 110 may send memory operation response(s) 136 to memory testing circuit 108. As further described below, memory testing circuit 108 may determine, using memory operation response(s) 136, whether memory 110 correctly performed the requested memory operation(s) from memory operation request(s) 126. In some embodiments, in response to determining that memory 110 correctly performed the requested memory operation(s), memory testing circuit 108 may send power-up test result(s) 134 to ATE 102, indicating whether the particular portion was operational at the specified time. Alternatively, power-up test result(s) 134 may be sent to BIST unit 106. In some cases, power-up test result(s) 134 may be sent to BIST unit 106 by modifying results of one or more signals from memory 110 to BIST unit 106 such that the one or more modified signals indicate whether the particular portion was operational at the specified time.

In a particular embodiment, memory testing circuit 108 is configured to iteratively test different portions of memory 110 (e.g., using a same specified amount of time or different specified amounts of time). In other words, in some cases, different portions of memory 110 may have different specified amounts of time (e.g., because different types of memory devices are included in memory 110). In a particular embodiment, memory testing circuit 108 is configured to iteratively test a single portion of memory 110 (e.g., using different specified amounts of time) and may send power-down requests to memory 110 between tests. Accordingly, memory testing circuit 108 may more accurately determine a time at which the single portion is operational, as compared to only performing a single test. In some embodiments, memory testing circuit 108 may transparently pass memory requests 122 to memory 110 as memory requests 124. Similarly, in some embodiments, memory testing circuit 108 may transparently pass memory responses 132 to BIST unit 106 as memory responses 130. Accordingly, memory testing circuit 108 may be used to test additional features (e.g., power-up time) of memory 110 that BIST unit 106 may be unable to test.

In various embodiments, memory 110 may be a volatile memory device (e.g., a static random access memory (SRAM) device or a dynamic random access memory (DRAM) device). Alternatively, memory 110 may be a non-volatile memory device or may include a combination of volatile memory and non-volatile memory. As further disclosed below with reference to FIG. 2, memory 110 may be divided into several portions. In some cases, the portions may be powered up or powered down independently or in various combinations. Alternatively, all portions of memory 110 may be powered up and powered down collectively.

Figure 2:
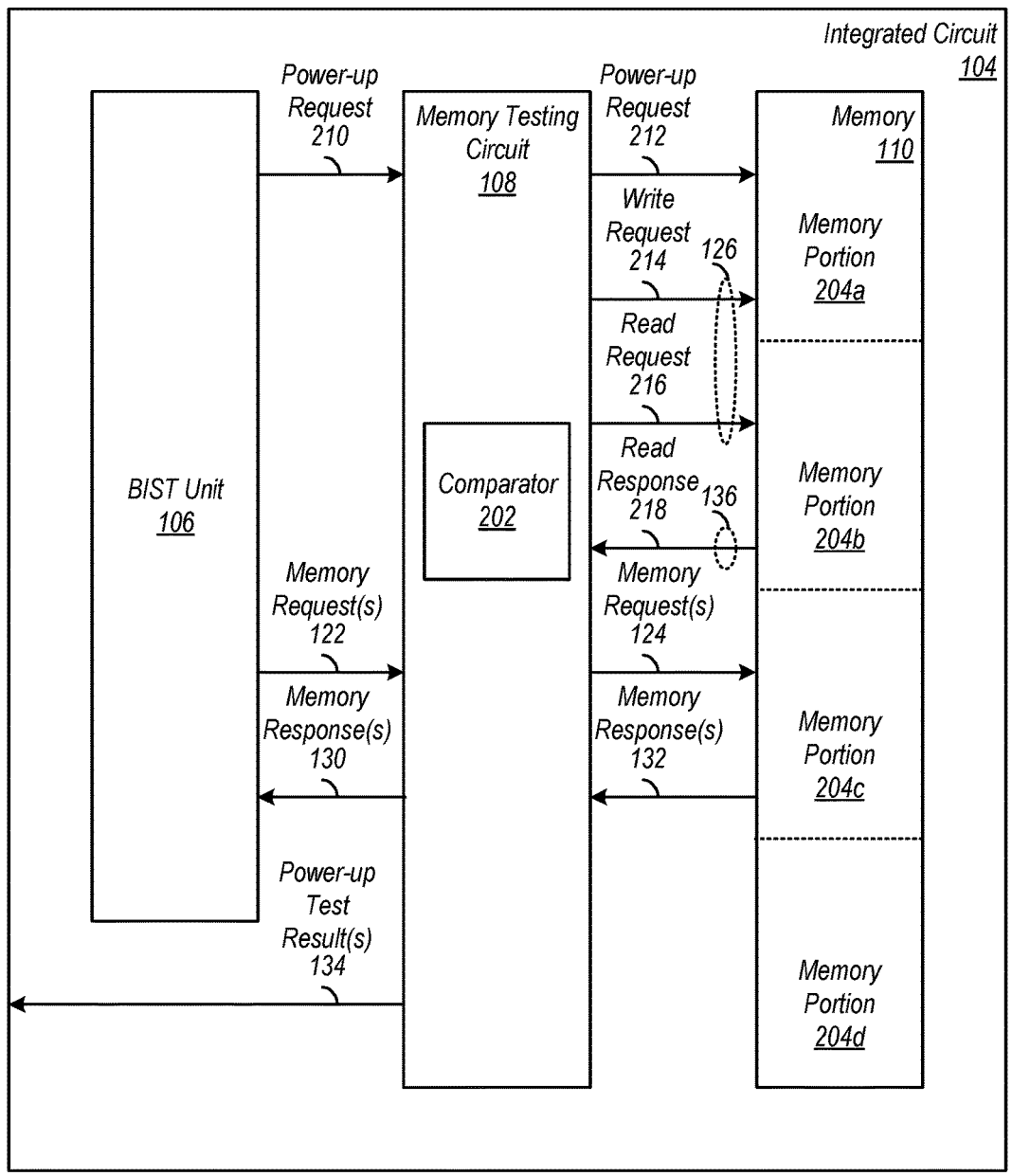
FIG. 2 is a block diagram illustrating an exemplary memory power-up test performed by one embodiment of an exemplary power-up testing system.

Turning now to FIG. 2, a block diagram illustrating components of memory testing system 100 performing an exemplary memory power-up test are shown. In the illustrated embodiment, memory testing circuit 108 includes comparator 202. In the illustrated embodiment, memory 110 includes four portions: memory portions 204a-d. However, in other embodiments, memory 110 may include fewer than four portions or greater than four portions.

As described above, in some embodiments, BIST unit 106 sends power-up request 210 to memory testing circuit 108, requesting a power-up of a portion of memory 110 (e.g., memory portion 204b). In some embodiments, power-up request 210 may be sent prior to BIST unit 106 implementing a test of the portion (e.g., a test other than a power-up test). In other embodiments, power-up request 210 may be sent to initiate a memory power-up test at memory testing circuit 108. Memory testing circuit 108 may forward power-up request 210 to memory 110 as power-up request 212.

In the illustrated embodiment, at a specified amount of time (e.g., an amount of time received at memory testing circuit 108 from ATE 102 of FIG. 1) after sending power-up request 212 to memory 110, memory testing circuit 108 may send write request 214 to a portion of memory 110. Write request 214 may request a write operation of data at the portion of memory 110 addressed by power-up request 212 (e.g., memory portion 204b). Subsequently, memory testing circuit 108 may send read request 216 to memory 110, requesting the data written in response to write request 214. In response to read request 216, memory 110 may send read response 218 to memory testing circuit 108. Comparator 202 may compare the data sent with write request 214 to the data received in read response 218. If comparator 202 detects a match, memory testing circuit 108 may determine that the portion of memory 110 was operational at the specified time. If comparator 202 does not detect a match, memory testing circuit 108 may determine that the portion of memory 110 was not operational at the specified time.

In other embodiments, other memory operations may be used to determine whether memory 110 was operational. For example, as discussed above, in some cases, the portion of memory 110 may include non-volatile memory. Prior to sending power-up request 212 to memory 110, a write request may be sent to the portion of memory 110. Memory testing circuit 108 may send read request 216 at the specified amount of time after power-up request 212. In some cases, memory 110 may return the data from the write request and memory testing circuit 108 may use comparator 202 to determine that the portion of memory 110 was operational. In other cases, memory 110 may not respond to read request 216 and memory testing circuit 108 may determine that the portion of memory 110 was not operational. Alternatively, memory 110 may respond with data that does not match the data from the write request and memory testing circuit 108 may determine that the portion of memory 110 was not operational. Accordingly, in some cases, memory testing circuit 108 may determine whether the portion of memory 110 was operational without sending write request 214. In other cases, other combinations of memory operations may be requested.

As discussed above, after a particular amount of time subsequent to power-up request 210, BIST unit 106 may send memory request(s) 122 to memory testing circuit 108 and memory testing circuit 108 may send memory request(s) 122 to memory 110 as memory request(s) 124. In response to memory request(s) 124, memory 110 may send memory response(s) 132 to memory testing circuit 108 and memory testing circuit may send memory response(s) 132 to BIST unit 106 as memory response(s) 130.

Although particular components are illustrated with respect to FIG. 2, in other embodiments, additional components may be included (e.g., ATE 102) or various components may be omitted. For example, in some cases, BIST unit 106 may be omitted. Instead, memory testing circuit 108 may be configured to generate power-up request 212 without receiving power-up request 210. Additionally, other configurations of the components of FIG. 2 may be used. For example, memory testing circuit 108 may not forward communications between BIST unit 106 and memory 110. Instead, memory testing circuit 108 may separately communicate with memory 110 (e.g., using one or more multiplexers). Additionally, although the communications are described herein as being in a particular order, in other embodiments, various communications may be sent in a different order. For example, power-up test result(s) 134 may be sent prior to memory request(s) 122.

Figure 3:
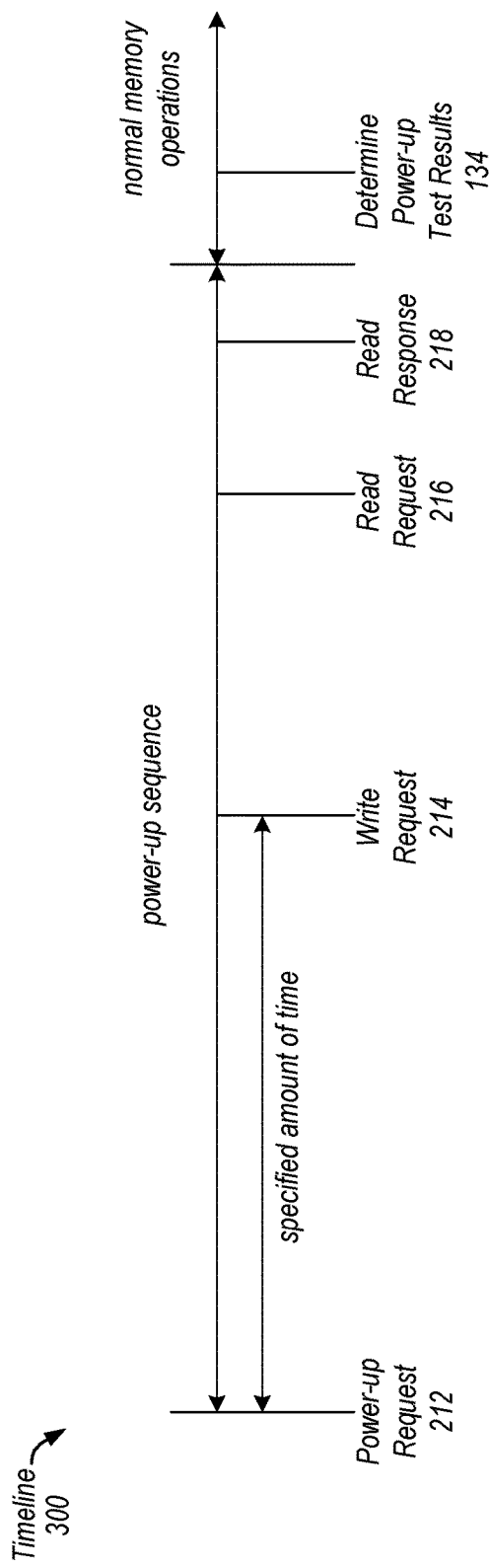
FIG. 3 is a block diagram illustrating an exemplary memory power-up test timeline.

Turning now to FIG. 3, an exemplary memory power-up test timeline is shown. Timeline 300 illustrates communications described above with reference to FIG. 2. In particular, timeline 300 illustrates power-up request 212, write request 214, read request 216, read response 218, and determination of power-up test results 134. However, as discussed above, in some embodiments, different timelines may occur. For example, the memory power-up test may include additional communications, fewer communications, or different communications.

In the illustrated embodiment, power-up request 212 begins a power-up sequence (e.g., an amount of time after a power-up request specified by a test circuit such as a BIST unit). At a specified amount of time after power-up request 212, write request 214 may be sent to memory 110. Subsequent to write request 214 being sent to memory 110, read request 216 may be sent to memory 110. In response to read request 216, read response 218 is received from memory 110. In response to read response 218, power-up test results 134 are determined. In the illustrated embodiment, after the power-up sequence, normal memory operations may be performed (e.g., memory operations in response to other memory requests). However, in other embodiments, such as when the system is iteratively testing a memory, the power-up sequence may be followed by a power-down sequence. Additionally, although, in the illustrated embodiment, determining the power-up test results 134 is performed during the normal memory operations, in other embodiments, determining the power-up test results 134 may be performed during the power-up sequence. In various embodiments, read response 218 or both read request 216 and read response 218 may be performed during normal memory operations.

Figure 4:
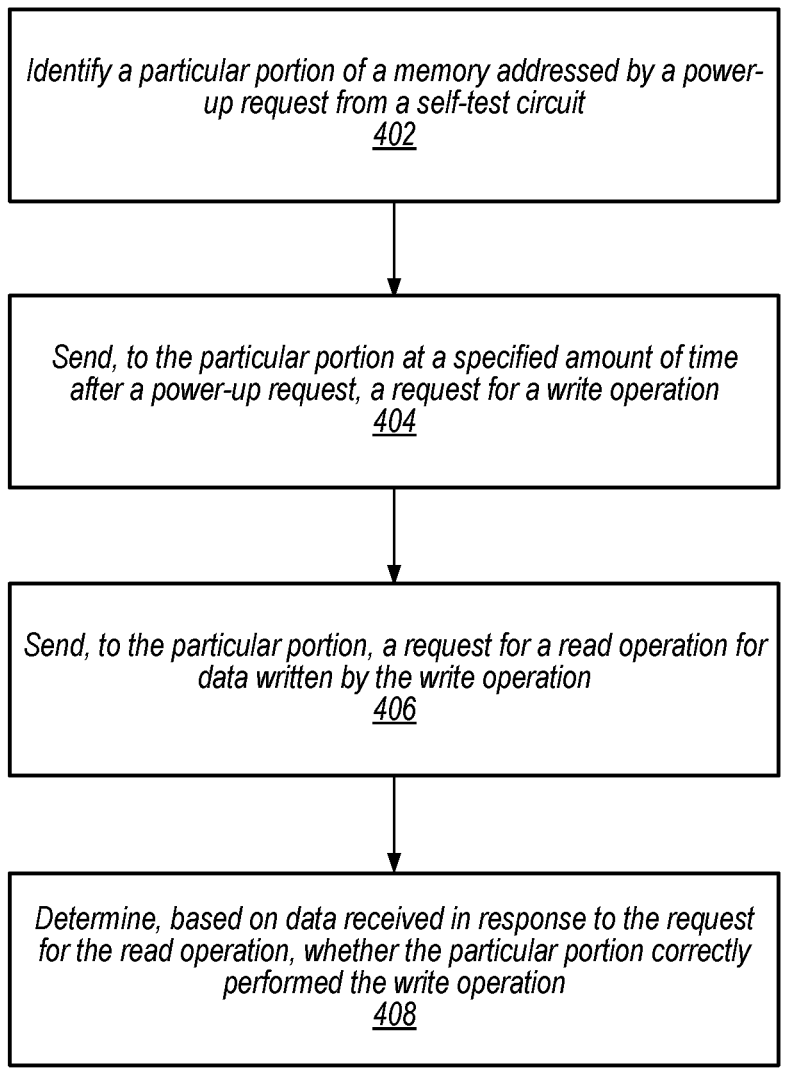
FIG. 4 is a flow diagram illustrating one embodiment of a method of performing a memory power-up test.

Referring now to FIG. 4, a flow diagram of a method 400 is depicted. Method 400 is an embodiment of a method of a method of performing a memory power-up test. In some embodiments, method 400 may be initiated or performed by one or more processors in response to one or more instructions stored by a computer-readable storage medium.

At 402, method 400 includes identifying a particular portion of a memory addressed by a power-up request from a self-test circuit. For example, method 400 may include memory testing circuit 108 of FIG. 2 identifying memory portion 204c of memory 110 addressed by power-up request 210 from BIST unit 106.

At 404, method 400 includes sending, to the particular portion at a specified amount of time after a power-up request, a request for a write operation. For example, method 400 may include memory testing circuit 108 sending write request 214 to memory portion 204c at a specified amount of time after power-up request 212.

At 406, method 400 includes sending, to the particular portion, a request for a read operation for data written by the write operation. For example, method 400 may include memory testing circuit 108 sending read request 216 to memory portion 204c, requesting data written in response to write request 214.

At 408, method 400 includes determining, based on data received in response to the request for the read operation, whether the particular portion correctly performed the write operation. For example, method 400 may include memory testing circuit 108 determining, using comparator 202, whether memory portion 204c correctly performed the write operation by comparing the data sent with write request 214 to the data received with read response 218. In response to comparator 202 identifying a match, memory testing circuit 108 may determine that memory portion 204c correctly performed the write operation. Accordingly, a method of performing a memory power-up test is depicted.

Figure 5:
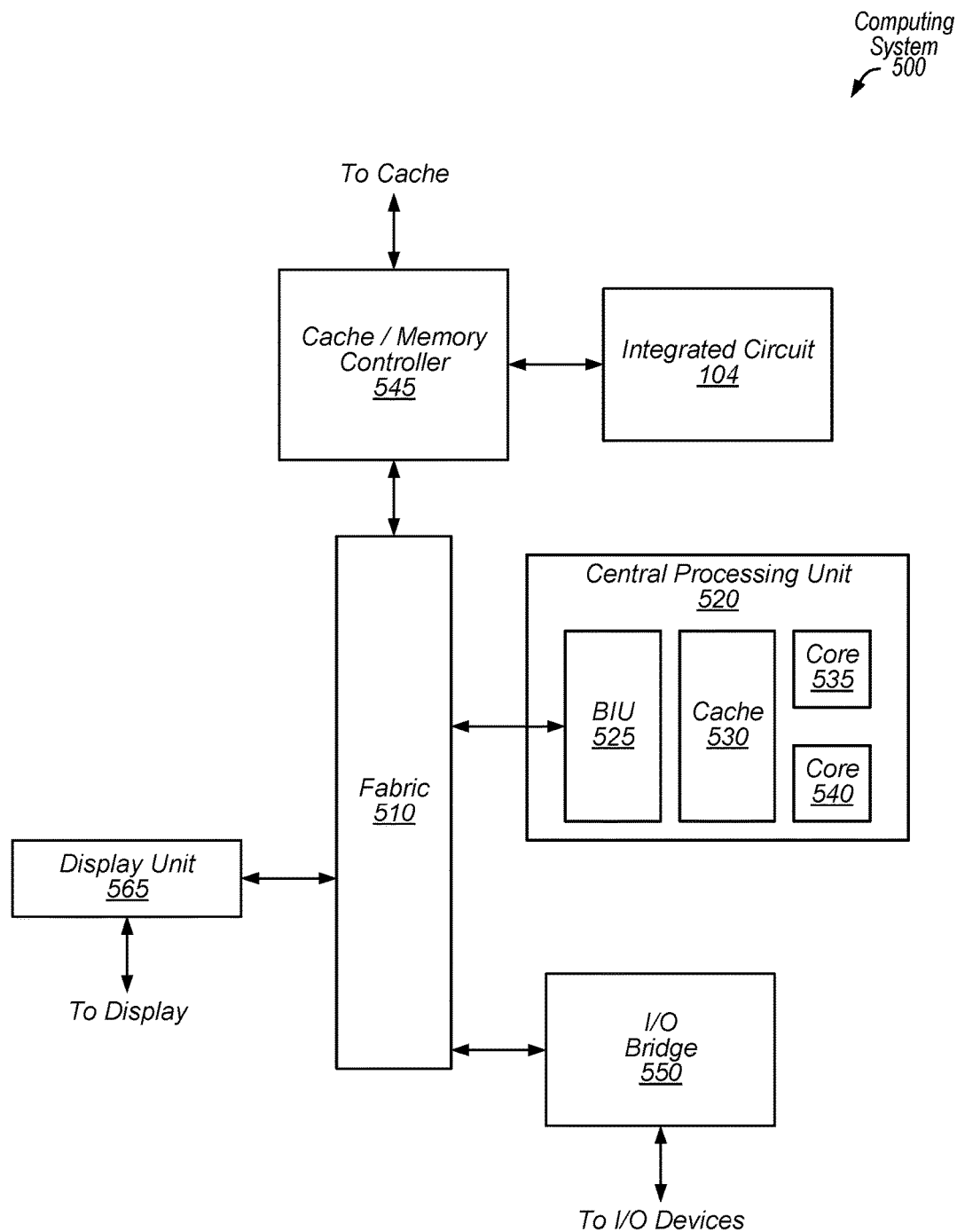
FIG. 5 is block diagram illustrating an embodiment of an exemplary computing system that includes at least a portion of an exemplary memory power-up testing system.

Turning next to FIG. 5, a block diagram illustrating an exemplary embodiment of a computing system 500 that includes at least a portion of an exemplary memory power-up testing system. Computing system 500 may include various circuits described above with reference to FIGS. 1-4. Computing system 500 may further include any variations or modifications described previously with reference to FIGS. 1-4. In some embodiments, some or all elements of the computing system 500 may be included within a system on a chip (SoC). In some embodiments, computing system 500 is included in a mobile device. Accordingly, in at least some embodiments, area, timing, and power consumption of computing system 500 may be important design considerations. In the illustrated embodiment, computing system 500 includes fabric 510, central processing unit (CPU) 520, input/output (I/O) bridge 550, cache/memory controller 545, and display unit 565. Although the computing system 500 illustrates central processing unit 520 as being connected to fabric 510 as a sole central processing unit of the computing system 500, in other embodiments, central processing unit 520 may be connected to or included in other components of the computing system 500 and other central processing units may be present. Additionally or alternatively, the computing system 500 may include multiple central processing units 520. The multiple central processing units 520 may correspond to different embodiments or to the same embodiment.

Fabric 510 may include various interconnects, buses, MUXes, controllers, etc., and may be configured to facilitate communication between various elements of computing system 500. In some embodiments, portions of fabric 510 are configured to implement various different communication protocols. In other embodiments, fabric 510 implements a single communication protocol and elements coupled to fabric 510 may convert from the single communication protocol to other communication protocols internally.

In the illustrated embodiment, central processing unit 520 includes bus interface unit (BIU) 525, cache 530, and cores 535 and 540. In some embodiments, cache 530 includes some or all of integrated circuit 104, which may correspond to any of the embodiments described above with reference to FIGS. 1-4. In various embodiments, central processing unit 520 includes various numbers of cores and/or caches. For example, central processing unit 520 may include 1, 2, or 4 processor cores, or any other suitable number. In some embodiments, cores 535 and/or 540 include internal instruction and/or data caches. In some embodiments, a coherency unit (not shown) in fabric 510, cache 530, or elsewhere in computing system 500 is configured to maintain coherency between various caches of computing system 500. BIU 525 may be configured to manage communication between central processing unit 520 and other elements of computing system 500. Processor cores 535 and 540 may be configured to execute instructions of a particular instruction set architecture (ISA), which may include operating system instructions and user application instructions. In some embodiments, integrated circuit 104 may be in multiple locations.

Cache/memory controller 545 may be configured to manage transfer of data between fabric 510 and one or more caches and/or memories (e.g., non-transitory computer readable mediums). For example, cache/memory controller 545 may be coupled to an L3 cache, which may, in turn, be coupled to a system memory. In the illustrated embodiment, cache/memory controller 545 is directly coupled to integrated circuit 104. In other embodiments, cache/memory controller 545 is directly coupled to one or more memories, such as memory 110. In some embodiments, the cache/memory controller 545 includes one or more internal caches, which may correspond to or include integrated circuit 104. In some embodiments, the cache/memory controller 545 may include or be coupled to one or more caches and/or memories that include instructions that, when executed by one or more processors, cause the processor, processors, or cores to initiate or perform some or all of the processes described above with reference to FIGS. 1-4.

As used herein, the term "coupled to" may indicate one or more connections between elements, and a coupling may include intervening elements. For example, in FIG. 5, display unit 565 may be described as "coupled to" central processing unit 520 through fabric 510. In contrast, in the illustrated embodiment of FIG. 5, display unit 565 is "directly coupled" to fabric 510 because there are no intervening elements.

Display unit 565 may be configured to read data from a frame buffer and provide a stream of pixel values for display. Display unit 565 may be configured as a display pipeline in some embodiments. Additionally, display unit 565 may be configured to blend multiple frames to produce an output frame. Further, display unit 565 may include one or more interfaces (e.g., MIPI® or embedded display port (eDP)) for coupling to a user display (e.g., a touchscreen or an external display).

I/O bridge 550 may include various elements configured to implement: universal serial bus (USB) communications, security, audio, and/or low-power always-on functionality, for example. I/O bridge 550 may also include interfaces such as pulse-width modulation (PWM), general-purpose input/output (GPIO), serial peripheral interface (SPI), and/or inter-integrated circuit (I2C), for example. Various types of peripherals and devices may be coupled to computing system 500 via I/O bridge 550. In some embodiments, central processing unit 520 may be coupled to computing system 500 via I/O bridge 550.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
a memory testing circuit configured to perform a test to determine whether a particular portion of a memory is operational at a specified amount of time after a power-up request, wherein the memory testing circuit is configured to perform the test by performing operations comprising:
sending a power-up request to the particular portion;
sending, at the specified amount of time after the power-up request, a write request that requests a write operation of data at the particular portion;
sending, after the write request, a read request that requests a read operation for data from the particular portion; and
determining, based on data received in response to the read request, whether the particular portion correctly performed the read operation and the write operation.

2. The apparatus of claim 1, wherein determining whether the particular portion correctly performed the read operation and the write operation includes comparing the data received in response to the read request to the data from the write request.

3. The apparatus of claim 2, wherein the memory testing circuit is configured to determine that the particular portion is operational at the specified amount of time in response to the data received in response to the read request matching the data from the write request.

4. The apparatus of claim 2, wherein the memory testing circuit is configured to determine that the particular portion is not operational at the specified amount of time in response to the data received in response to the read request not matching the data from the write request.

5. The apparatus of claim 1, wherein the operations further comprise, in response to determining that the particular portion was operational at the specified amount of time after the power-up request, determining, by performing the test again, whether the particular portion of the memory is operational at a different specified amount of time after the power-up request, wherein the different specified amount of time is smaller than the specified amount of time.

6. The apparatus of claim 1, wherein the memory testing circuit is further configured, subsequent to performing the test, to perform a different test to determine whether a different portion of the memory is operational at the specified amount of time after a different power-up request.

7. The apparatus of claim 1, further comprising a built-in self-test (BIST) unit configured to send a memory power-up request for the particular portion of the memory to the memory testing circuit, wherein the memory testing circuit is configured to perform the test in response to the memory power-up request.

8. The apparatus of claim 7, wherein the memory testing circuit is configured to receive one or more memory requests from the BIST unit and to pass the one or more memory requests to the memory.

9. The apparatus of claim 8, wherein the memory testing circuit is configured to receive one or more memory responses from the memory in response to the one or more memory requests and to pass the one or more memory responses to the BIST unit.

10. The apparatus of claim 1, wherein the memory testing circuit is configured, subsequent to performing the test, to indicate, to an external test circuit, whether the particular portion of the memory was operational at the specified amount of time after the power-up request.

11. The apparatus of claim 10, wherein the memory testing circuit is configured, prior to performing the test, to receive, from the external test circuit, an indication of the specified amount of time.

12. A method, comprising:
    identifying a particular portion of a memory addressed by a power-up request from a self-test circuit;
    sending, to the particular portion at a specified amount of time after a power-up request, a request for a write operation; and
    sending, to the particular portion, a request for a read operation for data written by the write operation; and
    determining, based on data received in response to the request for the read operation, whether the particular portion correctly performed the write operation.

13. The method of claim 12, further comprising performing a different test to determine whether a different portion of the memory is operational at a different specified amount of time after a different power-up request.

14. The method of claim 13, further comprising, prior to identifying the particular portion and prior to performing the different test, receiving an indication of the specified amount of time and the different specified amount of time, wherein the different specified amount of time is different from the specified amount of time.

15. An apparatus, comprising:
    a self-test circuit configured to test operation of a memory by requesting memory operations at the memory;
    a memory testing circuit configured to:
        identify a particular portion of the memory addressed by the self-test circuit;
        request, during a power-up sequence for the particular portion, one or more memory operations from the particular portion at a particular time after a power-up request that addresses the particular portion; and
        determine, based on data received from the particular portion, whether the particular portion correctly performed the one or more memory operations.

16. The apparatus of claim 15, wherein the memory testing circuit is further configured to modify one or more signals from the memory to the self-test circuit, and wherein the one or more modified signals indicate whether the particular portion correctly performed the one or more memory operations.

17. The apparatus of claim 15, wherein the memory is a volatile memory device, and wherein the one or more memory operations include a write operation and a read operation.

18. The apparatus of claim 15, wherein the memory is a nonvolatile memory device, and wherein the one or more memory operations include a read operation.

19. The apparatus of claim 15, wherein the memory testing circuit is further configured to receive, from the self-test circuit, one or more memory requests from the self-test circuit and to send the one or more memory requests to the memory.

20. The apparatus of claim 15, wherein the memory testing circuit is configured to receive one or more memory responses from the memory in response to the request for the one or more memory operations and to send the one or more memory responses to the self-test circuit.

* * * * *